United States Patent
Ryu

(10) Patent No.: US 7,629,735 B2
(45) Date of Patent: Dec. 8, 2009

(54) LIGHT EMISSION DEVICE AND DISPLAY DEVICE

(75) Inventor: Kyung-Sun Ryu, Yongin-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 450 days.

(21) Appl. No.: 11/692,863

(22) Filed: Mar. 28, 2007

(65) Prior Publication Data

US 2008/0030124 A1 Feb. 7, 2008

(30) Foreign Application Priority Data

Aug. 3, 2006 (KR) .................. 10-2006-0073272

(51) Int. Cl.
*H01J 1/62* (2006.01)
(52) U.S. Cl. .................. 313/495; 313/496
(58) Field of Classification Search .......... 313/495–497
See application file for complete search history.

(56) References Cited

FOREIGN PATENT DOCUMENTS

| JP | 09-97558 | 4/1997 |
|---|---|---|
| JP | 10-326556 | 12/1998 |
| JP | 2000-260303 | 9/2000 |
| JP | 2001-52599 | 2/2001 |

OTHER PUBLICATIONS

Patent Abstracts of Japan for Publication No. 09-097558; dated Apr. 8, 1997 in the name of Toshinao Suzuki et al.
Patent Abstracts of Japan for Publication No. 10-326556; dated Dec. 8, 1998 in the name of Kazuhiko Tsuburaya et al.
Patent Abstracts of Japan for Publication No. 2000-260303; dated Sep. 22, 2000 in the name of Eiji Yamaguchi.
Patent Abstracts of Japan for Publication No. 2001-052599; dated Feb. 23, 2001 in the name of Toshiro Yamagishi et al.

*Primary Examiner*—Vip Patel
(74) *Attorney, Agent, or Firm*—Christie, Parker & Hale, LLP

(57) ABSTRACT

A light emission device and a display device having the light emission device are provided. The light emission device includes a vacuum vessel having first and second substrates and a sealing member, electron emission regions and a light emission unit. The first and second electrodes are located on an inner surface of the first substrate and cross each other. The electron emission regions are electrically connected to the first electrodes or the second electrodes. The light emission unit is located on the second substrate. The first substrate has a lateral surface connected to the inner surface via an inclined surface. At least one of the first electrodes or the second electrodes extend from the inner surface of the first substrate to the lateral surface of the first substrate via the inclined surface to form electrode pads on the lateral surface of the first substrate.

16 Claims, 5 Drawing Sheets

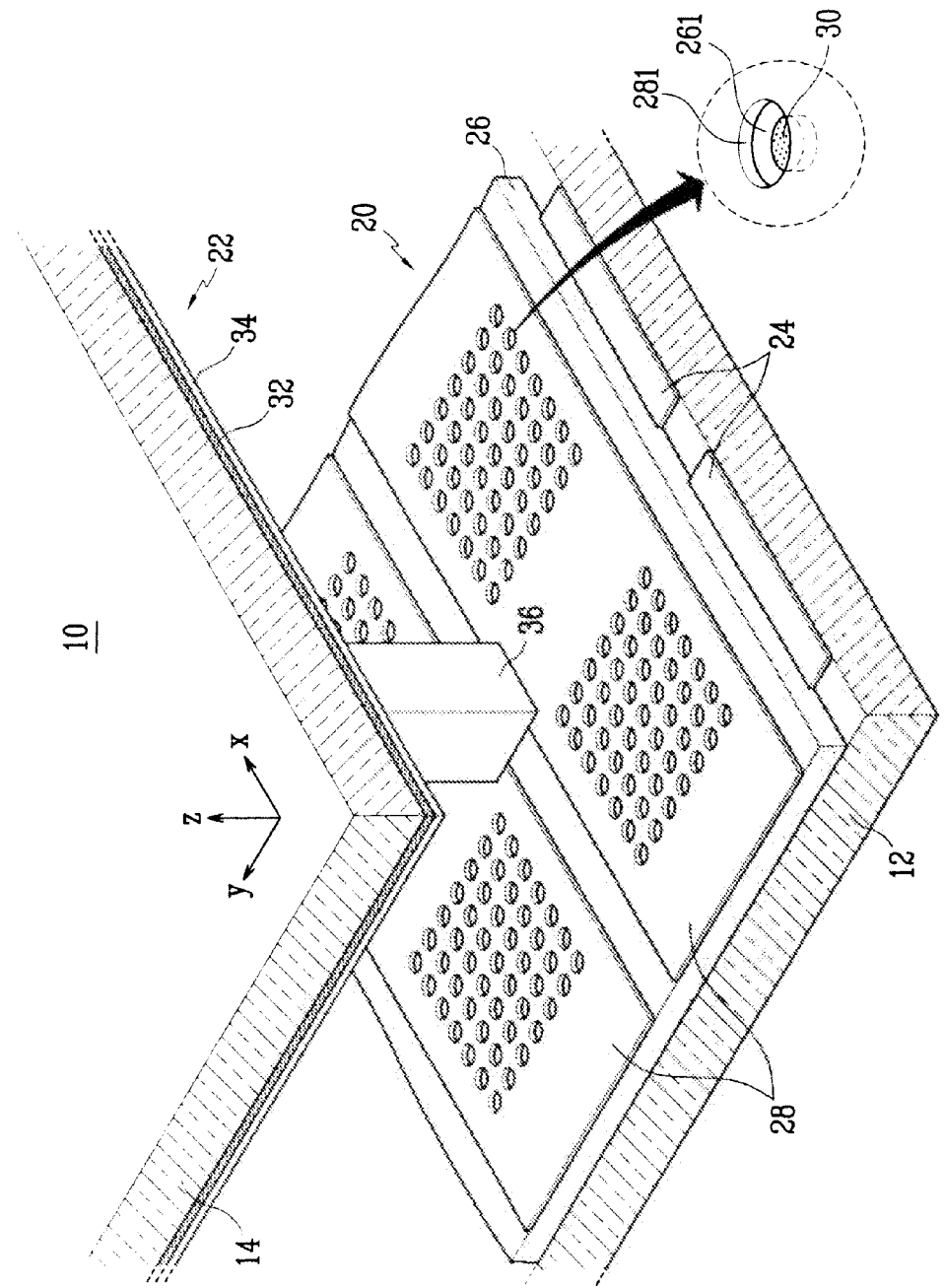

LIGHT EMISSION DEVICE AND DISPLAY DEVICE

CROSS-REFERENCE TO RELATED APPLICATION

This application claims priority to and the benefit of Korean Patent Application No. 10-2006-0073272 filed on Aug. 3, 2006, in the Korean Intellectual Property Office, the entire content of which is incorporated herein by reference.

BACKGROUND OF THE INVENTION

1. Field of the Invention

The present invention relates to a light emission device and a display device, and more particularly, to a light emission device and a display device using the light emission device as a light source.

2. Description of Related Art

A light emission device has a first substrate on which electron emission regions and driving electrodes are provided and a second substrate on which a phosphor layer and an anode electrode are provided. The light emission device emits visible light by exciting the phosphor layer using electrons emitted from the electron emission regions.

A sealing member is provided at or near the peripheries of the first and second substrates between the substrates to seal them together to form a vacuum vessel. The interior of the vacuum vessel is exhausted to a degree of vacuum of about $10^{-6}$ Torr. The light emission device may be used as a light source of a display device having a passive type display panel such as a liquid crystal panel.

In the conventional light emission device, an edge of the first substrate extends to outside of the vacuum vessel and an electrode pad is located on a surface of the extended edge portion of the first substrate. The electrode pad is electrically connected to a connecting member, and the connecting member is bent to face a rear surface of the first substrate after passing over a lateral surface of the first substrate and is connected to a circuit board assembly fixed on a rear surface of the first substrate.

Therefore, a significantly large inactive area that does not emit visible light exists at outside of the vacuum vessel. This causes an increase in the size of the display device. In addition, since the connecting member is bent many times, the contact stability between the electrode pad and the connecting member is deteriorated and thus there may be a contact error between the driving electrodes and the circuit board assembly.

SUMMARY OF THE INVENTION

Exemplary embodiments in accordance with the present invention provide a light emission device for improving contact stability between an electrode pad and a connecting member while reducing an area of an inactive area where no visible light is emitted, and a display device using the light emission device as a light source.

In an exemplary embodiment of the present invention, a light emission device includes a vacuum vessel having first and second substrates and a sealing member, each of the substrates having an inner surface and an outer surface, the inner surface of the first substrate facing the inner surface of the second substrate, first and second electrodes located on the inner surface of the first substrate and cross each other, electron emission regions electrically connected to the first electrodes or the second electrodes, and a light emission unit located on the inner surface of the second substrate, wherein the first substrate has a lateral surface connected to the inner surface via an inclined surface, and at least one of the first electrodes or the second electrodes extend from the inner surface of the first substrate to the lateral surface of the first substrate via the inclined surface to form electrode pads on the lateral surface of the first substrate.

The light emission device may further include a connecting member disposed on the lateral surface of the first substrate and electrically connected to the electrode pads. The light emission device may further include a circuit board assembly located at the outer surface of the first substrate. The connecting member may be bent from the lateral surface of the first substrate toward the outer surface of the first substrate and connected to the circuit board assembly.

The light emission unit may include a phosphor layer for emitting white light and an anode electrode located on the phosphor layer. The first and second substrates may be spaced apart from each other by a distance of 5-20 mm, and the anode electrode may be applied with a voltage of 10-15 kV. One set of electrodes among the first and the second electrodes may be scan electrodes and the other set of electrodes among the first and the second electrodes may be data electrodes.

In another exemplary embodiment of the present invention, a display device includes a display panel for displaying an image and a light emission device for emitting light toward the display panel. The light emission device includes a vacuum vessel having first and second substrates and a sealing member, each of the substrates having an inner surface and an outer surface, the inner surface of the first substrate facing the inner surface of the second substrate, first and second electrodes located on the inner surface of the first substrate and cross each other, electron emission regions electrically connected to the first electrodes or the second electrodes, and a light emission unit located on the inner surface of the second substrate, wherein the first substrate has a lateral surface connected to the inner surface via an inclined surface, and at least one of the first electrodes or the second electrodes extend from the inner surface of the first substrate to the lateral surface of the first substrate via the inclined surface to form electrode pads on the lateral surface of the first substrate.

The display panel may have first pixels and the light emission device may have second pixels, wherein a number of the second pixels may be less than a number of the first pixels, and an intensity of light emission of the second pixels may be independently controlled. The display panel may be a liquid crystal panel.

BRIEF DESCRIPTION OF THE DRAWINGS

A more complete appreciation of the present invention and many of the attendant features and aspects thereof, will be readily apparent as the present invention becomes better understood by reference to the following detailed description when considered in conjunction with the accompanying drawings in which like reference symbols indicate like components, wherein:

FIG. 2 is a partial exploded perspective view of the light emission device of FIG. 1;

DETAILED DESCRIPTION OF THE EMBODIMENTS

The present invention will now be described more fully with reference to the accompanying drawings, in which exemplary embodiments of the invention are shown. The invention may, however, be embodied in many different forms and should not be construed as being limited to the embodiments set forth herein; rather these embodiments are provided so that this disclosure will be thorough and complete, and will fully convey the concept of the invention to those skilled in the art.

When the light emission device is used as the light source of the display device, it is desirable to reduce or minimize an inactive area that does not emit visible light. Therefore, in exemplary embodiments according to the present invention, the inactive area on the light emitting surface of the light emission device is reduced.

Figure 1:
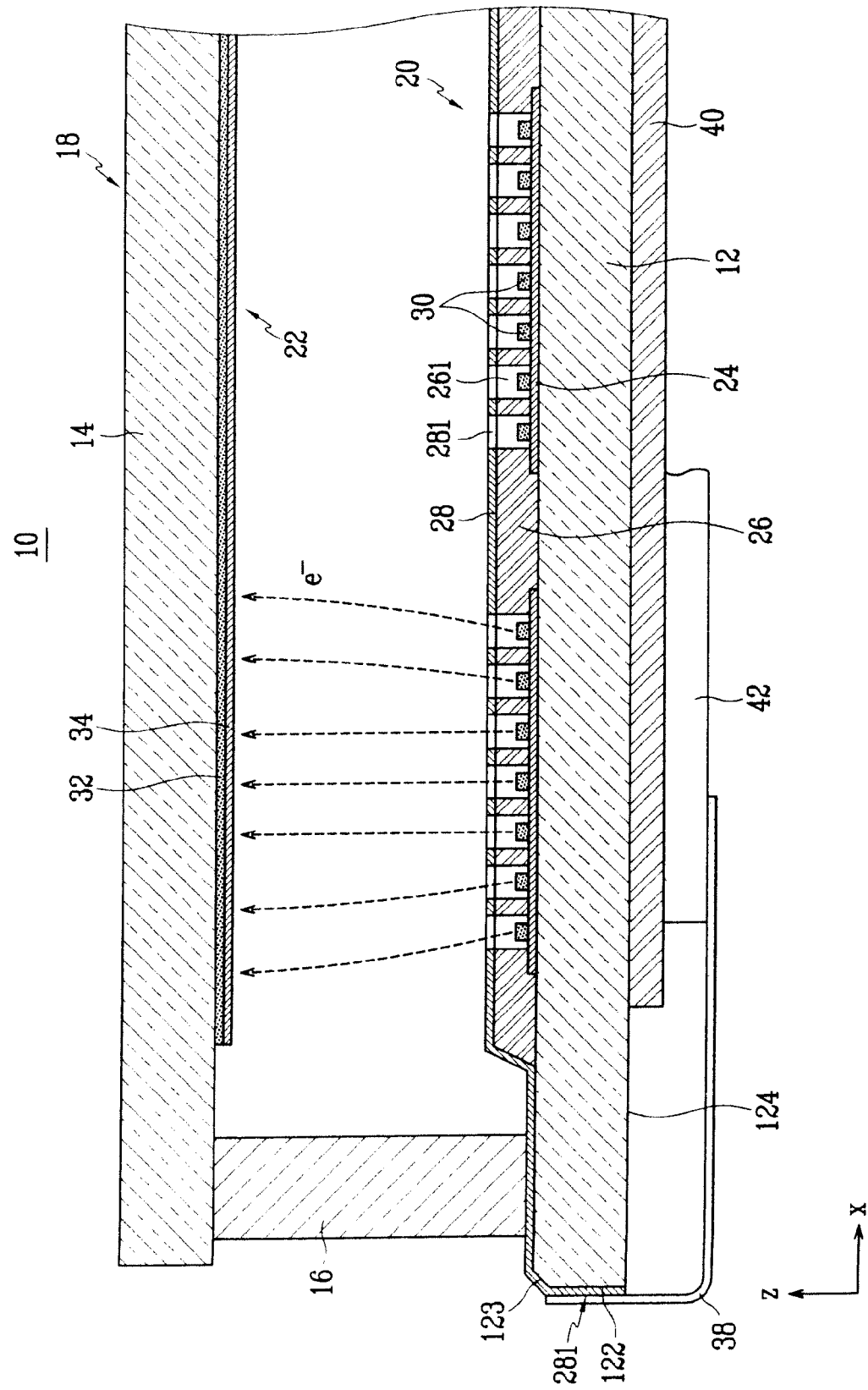
FIG. 1 is a partial sectional view of a light emission device according to an exemplary embodiment of the present invention.

Referring to FIGS. 1 and 2, a light emission device 10 includes a vacuum vessel (or vacuum envelope) 18 having first and second substrates 12 and 14 facing each other in parallel with a predetermined interval (or gap or distance) between them. A sealing member (or sealer) 16 is provided at or near the peripheries of the first and second substrates 12 and 14 between the substrates to seal them together to form the vacuum vessel 18. The interior of the vacuum vessel 18 is exhausted during the manufacturing process of the light emission device, to a degree of vacuum of about $10^{-6}$ Torr.

An electron emission unit 20 is provided on an inner surface of the first substrate 12, and a light emission unit 22 for emitting visible light is provided on an inner surface of the second substrate 14.

The electron emission unit 20 includes first and second electrodes 24 and 28 that are arranged in stripe patterns crossing each other with an insulation layer 26 interposed therebetween. Electron emission regions 30 are electrically connected to the first electrodes 24 in the embodiment illustrated in FIG. 1. However, in other embodiments, the electron emission regions may be electrically connected to the second electrodes 28.

When the electron emission regions 30 are formed on the first electrodes 24, the first electrodes 24 function as cathode electrodes for applying a current to the electron emission regions 30 and the second electrodes 28 function as gate electrodes for inducing electron emission by forming an electric field using a voltage difference with the cathode electrodes. Alternatively, when the electron emission regions 30 are formed on the second electrodes 28, the second electrodes 28 function as the cathode electrodes and the first electrodes 24 become the gate electrodes.

Among the first and second electrodes 24 and 28, electrodes (e.g., second electrodes 28) extending in a row direction (i.e., an x-axis in FIGS. 1 and 2) of the light emission device 10 function mainly as scan electrodes applied with a scan driving voltage, and electrodes (e.g., first electrodes 24) extending in a column direction (i.e., a y-axis in FIG. 2) of the light emission device 10 function as data electrodes that are applied with data driving voltage.

In one embodiment, openings 281 and openings 261 are respectively formed in the second electrodes 28 and the insulation layer 26 at respective regions where the first and second electrodes 24 and 28 cross each other, thereby partly exposing the surface of the first electrodes 24. Electron emission regions 30 are located on the first electrodes 24 in the openings 261 of the insulation layer 26. However, the present invention is not limited to this embodiment.

The electron emission regions 30 are formed of a material that emits electrons when an electric field is formed around thereof under a vacuum atmosphere, such as a carbon-based material or a nanometer-sized material. For example, the electron emission regions 30 may include at least one of materials selected from the group consisting of carbon nanotubes, graphite, graphite nanofibers, diamonds, diamond-like carbon, fullerene $C_{60}$, silicon nanowires, and combinations thereof. As to a method for forming the electron emission regions 30, a screen-printing process, a direct growth process, a chemical vapor deposition process, or a sputtering process may be used.

Alternatively, the electron emission regions may be formed to have a tip structure made of a molybdenum-based material or a silicon-based material.

In the above-described structure, each of regions where the first electrodes 24 cross the second electrodes 28 corresponds to a single pixel area of the light emission device. Alternatively, two or more of the crossing regions may correspond to the single pixel area. In this case, two or more of the first electrodes 24 and/or two or more of the second electrodes 28, which correspond to the single pixel area, are electrically connected to each other to receive a common driving voltage.

The light emission unit 22 includes a phosphor layer 32 and an anode electrode 34 located on a surface of the phosphor layer 32. The phosphor layer 32 may be formed of a mixture of red, green and blue phosphors to emit white light. The phosphor layer 32 may be formed on an entire active area of the second substrate 14 or in a pattern (e.g., a predetermined pattern) having a plurality of sections corresponding to respective pixel areas.

Alternatively, the phosphor layer 32 may include red, green, and blue phosphor layers that are formed in each pixel area and with a pattern (e.g., a predetermined pattern). In FIGS. 1 and 2, a case where a phosphor layer for emitting white light is formed on the entire active area of the second substrate 14 is illustrated as an example.

The anode electrode 34 is formed of a metal layer such as an aluminum (Al) layer. The anode electrode 34 is an acceleration electrode that receives a high voltage to place the phosphor layer 32 at a high electric potential state. The anode electrode 34 enhances the screen luminance by reflecting the visible light, which is emitted from the phosphor layer 32 toward the first substrate 12, to the second substrate 14.

Disposed between the first and second substrates 12 and 14 are spacers 36 (see FIG. 2) that are able to withstand compression force applied to the vacuum vessel 18 and to uniformly maintain a gap between the first and second substrates 12 and 14.

In the light emission device 10, the plurality of pixel areas are formed by the combination of the first and second electrodes 24 and 28 that are driving electrodes. The light emission device 10 is driven by applying driving voltages (e.g., predetermined driving voltages) to the first and second electrodes 24 and 28 and by applying a positive direct current voltage (i.e., anode voltage) of thousands of volts or more to the anode electrode 34.

Electric fields are formed around the electron emission regions 30 at the pixels where the voltage difference between the first and second electrodes 24 and 28 is equal to or greater than the threshold value, and thus electrons are emitted from the electron emission regions 30. The emitted electrons collide with a corresponding portion of the phosphor layer 32 of the corresponding pixels by being attracted by the high voltage applied to the anode electrode 34, thereby exciting the phosphor layer 32. A light emission intensity of the phosphor layer 32 for each pixel corresponds to an electron emission amount of the corresponding pixel.

In the foregoing exemplary embodiment, the first and second substrates 12 and 14 are spaced apart from each other by a relatively large distance of about 5-20 mm. By enlarging the distance between the substrates 12 and 14, the arcing generation in the vacuum vessel 18 can be reduced. The anode electrode 34 may be applied with a voltage of 10 kV or more. In one embodiment, the anode electrode 34 is applied with 10-15 kV.

The above-described light emission device 10 can realize a luminance of 10,000 $cd/m^2$ at a central portion of the active area. That is, the light emission device 10 can realize a higher luminance with a lower electric power consumption compared with a cold cathode fluorescent lamp (CCFL) type light emission device and a light emitting diode (LED) type light emission device.

In the above-described structure, one end of the first electrode 24 and one end of the second electrode 28 extend to outside of the vacuum vessel (i.e., outer side of the sealing member 16) to form respective electrode pads for being applied with a driving voltage. In the present exemplary embodiment, the electrode pads are formed on a lateral surface of the first substrate 12 rather than on an inner surface (e.g., a top surface) of the first substrate 12.

Figure 3A:
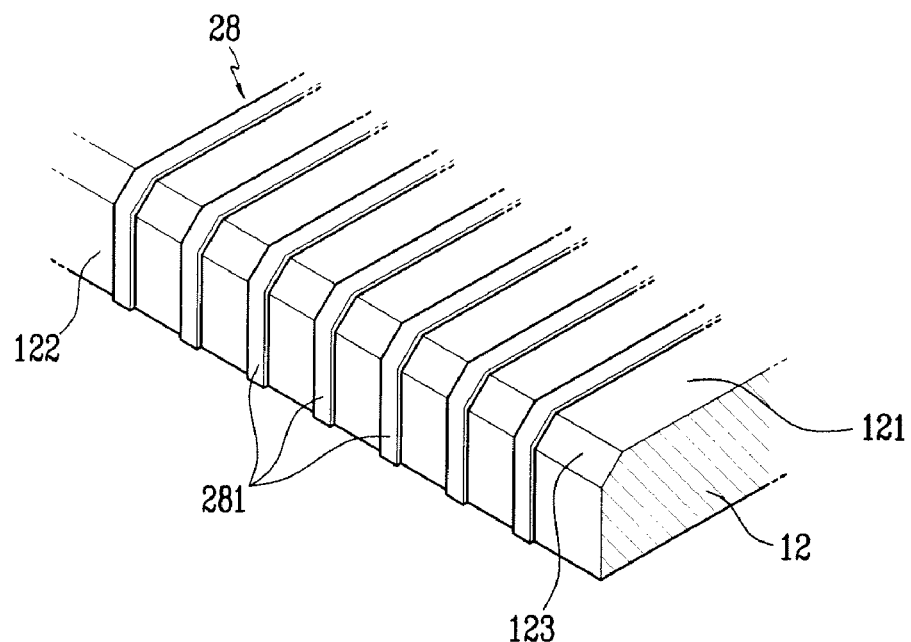
FIG. 3A is a partial perspective view of a first substrate and second electrodes of the light emission device of FIGS. 1 and 2.
Figure 3B:
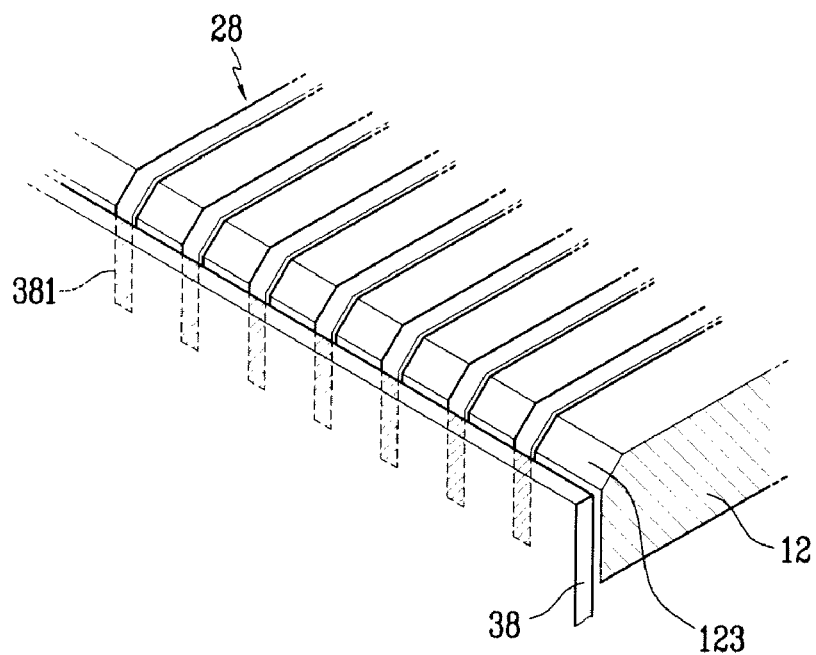
FIG. 3B is a partial perspective view of a first substrate, second electrodes, and a connecting member of the light emission device of FIGS. 1 and 2.

FIG. 3A is a partial perspective view illustrating a state of the light emission device before the connecting member is fixed to the electrode pads, and FIG. 3B is a partial perspective view illustrating a state of the light emission device after the connecting member is fixed to the electrode pads.

Referring to FIG. 3A, the first substrate 12 is provided with an inclined surface (or sloped surface) 123 formed along an edge, to which the second electrodes 28 extend to an outer side of the sealing member 16 (i.e., external to the vacuum vessel) shown in FIG. 1, by chamfering (or cutting) a corner between a top surface 121 and a lateral surface 122. The second electrodes 28 extend to the lateral surface 122 of the first substrate 12 over the top surface 121 and the inclined surface 123 to form the electrode pads 281 at the lateral surface 122 of the first substrate 12.

The inclined surface 123 prevents the second electrodes 28 from being damaged by an acute corner of the first substrate 12 when the second electrodes 28 are formed over the top and lateral surfaces 121 and 122. The electrode pads 281 located on the lateral surface 122 of the first substrate 12 may be effectively formed through a screen-printing process or a dispensing process, for example.

Referring to FIG. 3B, a connecting member 38 is fixed on the electrode pads 281 to connect the electrode pads 281 to respective metal lines 381 formed on the connecting member 38, after which the connecting member 38 is connected to a second electrode controller 42 (e.g., see FIG. 1) of a circuit board assembly 40 (e.g., see FIG. 1) fixed on an outer surface (i.e., rear surface) of the first substrate 12 so that the second electrodes 28 can be applied with a relevant driving voltage from the second electrode controller 42.

As the connecting member 38, a flexible printed circuit (FPC) may be used in one embodiment. The FPC is bent to face the rear surface 124 of the first substrate 12 and then connected to the second electrode controller 42.

The above-described structure of the electrode pads and the connecting structure of the connecting member are identically applied to the first electrodes and a first electrode controller (not shown).

Figure 4:
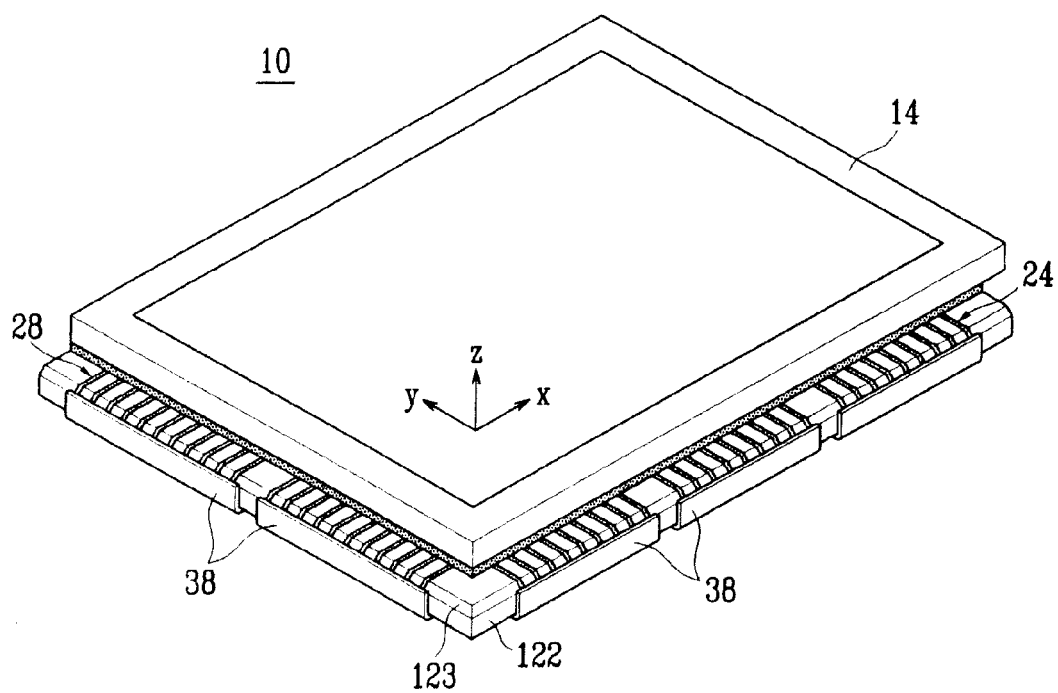
FIG. 4 is a perspective view of a light emission device according to an exemplary embodiment of the present invention.

In the light emission device 10 according to the present exemplary embodiment, since the electrode pads 281 are formed on the lateral surface 122 of the first substrate 12 rather than the top surface 121 of the first substrate 12, an area of the inactive area where no visible light is emitted can be reduced. Furthermore, since the connecting member 38 is bent from the lateral surface 122 toward the rear surface 124 of the first substrate 12, the contact stability between the electrode pads 281 and the driving circuit assembly 40 is increased, and thus the contact error between the electrode pads 281 and the driving circuit assembly 40 can be effectively suppressed. FIG. 4 shows the light emission device 10 when the mounting of the connecting member 38 relative to the first and second electrodes 24 and 28 is completed.

Figure 5:
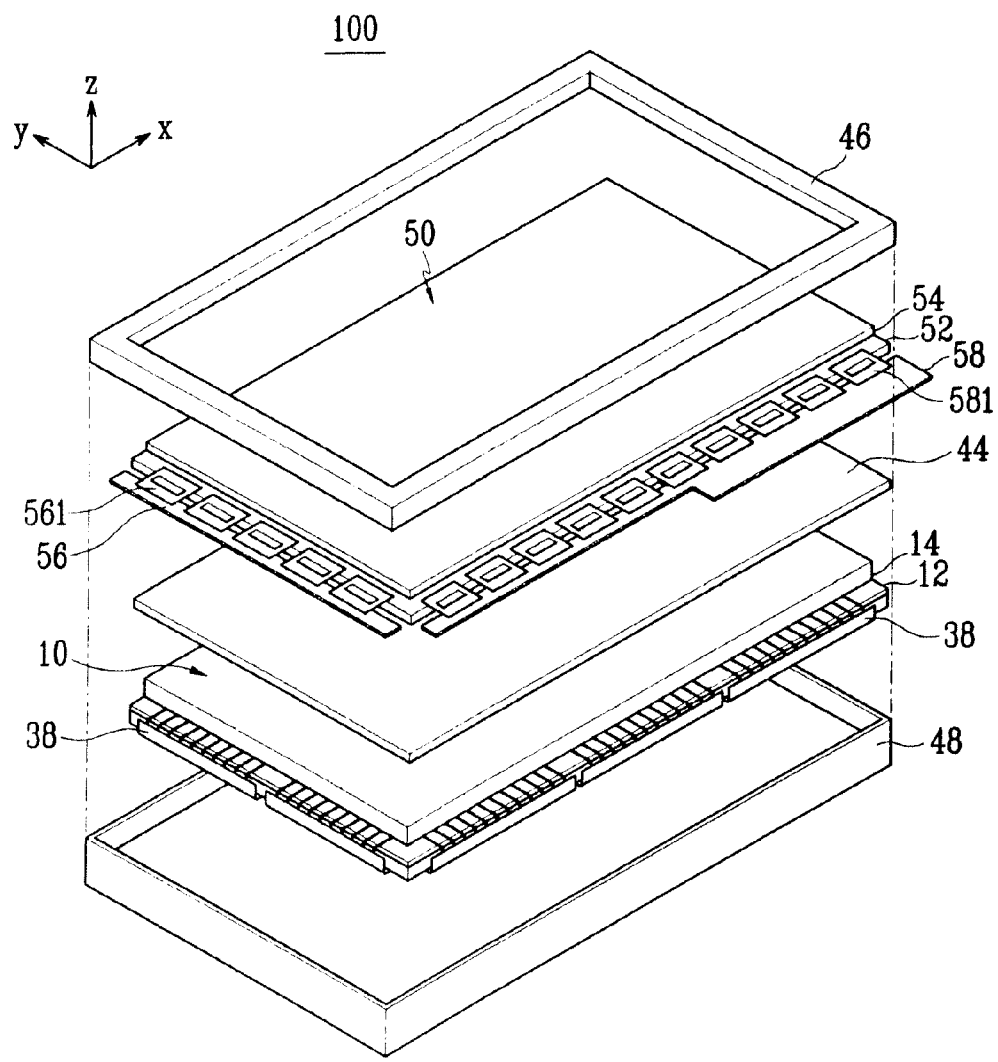
FIG. 5 is an exploded perspective view of a display device according to an exemplary embodiment of the present invention.

FIG. 5 is an exploded perspective view of a display device using the above described light emission device of FIGS. 1 through 3 as a light source according to an exemplary embodiment of the present invention. A display device illustrated in FIG. 5 is only provided as an example, and the present invention is not limited thereto.

Referring to FIG. 5, a display device 100 includes a light emission device 10 and a display panel 50 located in front of the light emission device 10. In the embodiment illustrated in FIG. 5, a diffuser plate 44 for uniformly diffusing light emitted from the light emission device 10 to the display panel 50 is located between the light emission device 10 and the display panel 50. The diffuser plate 44 is spaced apart from the light emission device 10 (e.g., by a predetermined distance). A top chassis 46 is located in front of the display panel 50 and a bottom chassis 48 is located at rear of (or behind) the light emission device 10.

A liquid crystal panel or other light receiving type (e.g., not-emissive type) display panels may be used as the display panel 50. In the following description, a case where the display panel 50 is the liquid crystal panel will be explained as an example. However, the present invention is not limited thereto.

The display panel 50 includes a thin film transistor (TFT) panel 52 having a plurality of TFTs, a color filter panel 54 located above the TFT panel 52, and a liquid crystal layer (not shown) formed between the panels 52 and 54. Polarizing plates (not shown) are attached on a top surface of the color filter panel 54 and a bottom surface of the TFT panel 52 to polarize the light passing through the display panel 50.

Each of the TFTs has a source terminal connected to a corresponding one of data lines, a gate terminal connected to a corresponding one of gate lines, and a drain terminal connected to a corresponding one of pixel electrodes formed of a transparent conductive material. When an electric signal is input from circuit board assemblies 56 and 58 to the respective gate and data lines, the electric signal is input to the gate and source terminals of the TFT, and the TFT is turned on or off in accordance with the electric signal to output an electric signal required for driving the pixel electrodes to the drain terminal.

The color filter panel 54 is a panel on which RGB color filters for emitting color lights when the light passes therethrough, are formed through a thin film process. A common electrode formed of a transparent conductive material is formed on an entire surface of the color filter panel 54. When the TFT is turned on by applying electric power to the gate and source terminals, an electric field is formed between the pixel electrode and the common electrode. A twisting angle of liquid crystal molecules between the TFT panel 52 and the color filter panel 54 is varied, in accordance with which, the light transmittance of the corresponding pixel is varied.

The circuit board assemblies 56 and 58 of the display panel 50 are respectively connected to driving IC packages 561 and 581. In order to drive the display panel 50, the gate circuit board assembly 56 transmits a gate driving signal, and the data circuit board assembly 58 transmits a data driving signal.

The light emission device 10 includes a plurality of pixels, the number of which is less than the number of pixels of the display panel 50 so that one pixel of the light emission device 10 corresponds to two or more of the pixels of the display panel 50. Each pixel of the light emission device 10 emits light corresponding to a highest gray level among gray levels of the corresponding pixels of the display panel 50. The light emission device 10 can represent a 2-8 bit gray at each pixel.

For convenience of description, the pixels of the display panel 50 are referred to as first pixels and the pixels of the light emission device 10 are referred to as second pixels. The first pixels corresponding to one second pixel is referred to as a first pixel group.

Describing a driving process of the light emission device 10, a signal control unit (not shown) for controlling the display panel 50 detects the highest gray level of the first pixel group, determines a gray level required for emitting light from the second pixel in response to the detected highest gray level, converts the determined gray level into digital data, and generates a driving signal of the light emission device 10 using the digital data. The driving signal of the light emission device 10 includes a scan driving signal and a data driving signal.

Scan and data circuit board assemblies (not shown) of the light emission device 10 are respectively connected to driving IC packages (not shown). In order to drive the light emission device 10, the scan circuit board assembly transmits a scan driving signal, and the data circuit board assembly transmits a data driving signal.

When an image is displayed on the first pixel group, the corresponding second pixel of the light emission device 10 emits light with a suitable gray level (e.g., the determined gray level) by synchronizing with the first pixel group. As described above, the light emission device 10 controls a light emission intensity of each pixel independently, and thus provides a proper intensity of light to the corresponding pixels of the display panel 50. As a result, the display device 100 of the present exemplary embodiment can enhance the dynamic contrast of the screen, thereby improving the display quality.

Although exemplary embodiments of the present invention have been described in detail hereinabove, it should be clearly understood that many variations and/or modifications of the basic inventive concept taught herein still fall within the spirit and scope of the present invention, as defined by the appended claims and their equivalents.

What is claimed is:

1. A light emission device comprising:
a vacuum vessel having first and second substrates and a sealing member, each of the substrates having an inner surface and an outer surface, the inner surface of the first substrate facing the inner surface of the second substrate;
first and second electrodes located on the inner surface of the first substrate and cross each other;
electron emission regions electrically connected to the first electrodes or the second electrodes; and
a light emission unit located on the inner surface of the second substrate,
wherein the first substrate has a lateral surface connected to the inner surface via an inclined surface; and
at least one of the first electrodes or the second electrodes extend from the inner surface of the first substrate to the lateral surface of the first substrate via the inclined surface to form electrode pads on the lateral surface of the first substrate.

2. The light emission device of claim 1, further comprising a connecting member disposed on the lateral surface of the first substrate and electrically connected to the electrode pads.

3. The light emission device of claim 2, further comprising a circuit board assembly located at the outer surface of the first substrate, wherein the connecting member is bent from the lateral surface of the first substrate toward the outer surface of the first substrate and connected to the circuit board assembly.

4. The light emission device of claim 1, wherein the light emission unit comprises:
a phosphor layer for emitting white light; and
an anode electrode located on the phosphor layer.

5. The light emission device of claim 4, wherein the first and second substrates are spaced apart from each other by a distance of 5-20 mm, and the anode electrode is applied with a voltage of 10-15 kV.

6. The light emission device of claim 1, wherein one set of electrodes among the first and the second electrodes are scan electrodes and the other set of electrodes among the first and the second electrodes are data electrodes.

7. A display device comprising:
a display panel for displaying an image; and
a light emission device for emitting light toward the display panel,
wherein the light emission device comprises:
a vacuum vessel having first and second substrates and a sealing member, each of the substrates having an inner surface and an outer surface, the inner surface of the first substrate facing the inner surface of the second substrate;
first and second electrodes located on the inner surface of the first substrate and cross each other;
electron emission regions electrically connected to the first electrodes or the second electrodes; and
a light emission unit located on the inner surface of the second substrate,
wherein the first substrate has a lateral surface connected to the inner surface via an inclined surface; and
at least one of the first electrodes or the second electrodes extend from the inner surface of the first substrate to the lateral surface of the first substrate via the inclined surface to form electrode pads on the lateral surface of the first substrate.

8. The display device of claim 7, further comprising a connecting member disposed on the lateral surface of the first substrate and electrically connected to the electrode pads.

9. The display device of claim 8, further comprising a circuit board assembly located at the outer surface of the first substrate, wherein the connecting member is bent from the lateral surface of the first substrate toward the outer surface of the first substrate and connected to the circuit board assembly.

10. The display device of claim 7, wherein the light emission unit comprises:
a phosphor layer for emitting white light; and
an anode electrode located on the phosphor layer.

11. The display device of claim 10, wherein the first and second substrates are spaced apart from each other by a distance of 5-20 mm, and the anode electrode is applied with a voltage of 10-15 kV.

12. The display device of claim 7, wherein the display panel has first pixels and the light emission device has second pixels, a number of the second pixels being less than a number of the first pixels, and an intensity of light emission of each of the second pixels is independently controlled.

13. The display device of claim 7, wherein the display panel is a liquid crystal panel.

14. A light emission device comprising:
- a first substrate having a front surface, a rear surface, and a connecting surface and a side surface located between the front and rear surfaces, the connecting surface forming an obtuse angle with both the front surface and the side surface;
- first electrodes and second electrodes located on the front surface of the first substrate, wherein the first and second electrodes cross each other;
- a plurality of electron emission regions located at crossing areas between the first and second electrodes;
- a second substrate having a light emission unit located thereon, the second substrate facing the first substrate; and
- a sealer located between the first and second substrates near peripheries of the substrates, the sealer forming a vacuum envelope together with the first and second substrates, wherein
- at least one of the first electrodes or the second electrodes extend from the front surface of the first substrate to the side surface of the first substrate via the connecting surface to form electrode pads on the side surface of the first substrate.

15. The electron emission device of claim 14, further comprising a connector disposed on the side surface of the first substrate and electrically connected to the electrode pads.

16. The electron emission device of claim 15, further comprising a circuit board assembly located at the rear surface of the first substrate, wherein the connector is bent from the side surface toward the rear surface and is connected to the circuit board assembly.

* * * * *